United States Patent [19]

Dugan

[11] 4,139,434
[45] Feb. 13, 1979

[54] METHOD OF MAKING CIRCUITRY WITH BUMP CONTACTS

[75] Inventor: William P. Dugan, Pomona, Calif.

[73] Assignee: General Dynamics Corporation, Pomona, Calif.

[21] Appl. No.: 873,460

[22] Filed: Jan. 30, 1978

[51] Int. Cl.² ............... C25F 3/16; C25D 7/00; C25D 7/06
[52] U.S. Cl. .............. 204/129.35; 156/644; 156/666; 204/24
[58] Field of Search ........... 204/24, 129.1, 129.55, 204/129.35, 34; 156/644, 659, 664, 666; 427/97, 105, 239, 307, 328

[56] References Cited

U.S. PATENT DOCUMENTS

| | | | |
|---|---|---|---|
| 3,314,869 | 4/1967 | Dobbin et al. | 204/129.8 |
| 3,325,319 | 6/1967 | Frantzen | 156/644 |
| 3,329,541 | 7/1967 | Mears | 156/644 |
| 3,519,543 | 7/1970 | Gwyn, Jr. | 204/35 R |
| 3,719,567 | 3/1973 | Ono et al. | 204/34 |

FOREIGN PATENT DOCUMENTS 7309840  1/1975  Netherlands .................. 156/644

OTHER PUBLICATIONS

IBM Tech. Disclosure Bulletin, vol. 12, No. 4, Sep. 1969, p. 559.

*Primary Examiner*—T. M. Tufariello
*Attorney, Agent, or Firm*—Henry M. Bissell; Edwin A. Oser; Edward B. Johnson

[57] ABSTRACT

A process for manufacturing a carrier for semiconductor devices such as integrated chips. The carrier conventionally comprises, on one surface, a lead circuit providing leads to the conduction pads of the semiconductor devices. The other side may be called a bump circuit and includes bonding pads or bumps to contact corresponding elements of the semiconductor devices. Small size bumps are made by applying the etching solution only to the lead circuit which has previously been coated with photoresist as well as the bump circuit. Eventually, the etching solution will run over the bump circuit, thereby to create bumps or pads without reducing the thickness of the lead circuit to less than about 2 mils thickness. The resulting carrier may then be polished and covered with a layer of nickel and a layer of gold.

7 Claims, 5 Drawing Figures

METHOD OF MAKING CIRCUITRY WITH BUMP CONTACTS

CROSS REFERENCES TO RELATED APPLICATIONS

The present application is related to the application to Dugan and Phillips, entitled "Bump Circuits on Tape", assigned to the assignee of the present application and filed concurrently herewith Ser. No. 873,453 and to the application to Dugan entitled "Isolated Bump Circuitry On Tape Electroformed" also filed concurrently herewith Ser. No. 873,461 and also assigned to the assignee of the present application.

BACKGROUND OF THE INVENTION

1. Field of the Invention

This invention relates generally to a process for manufacturing carriers for semiconductor devices such as integrated chips and particularly relates to such a process for manufacturing the bump circuits of such carriers.

2. Description of the Prior Art

It is well known to provide carriers for semiconductor devices such as integrated circuit chips. Such carriers usually have a lead circuit represented by one surface of the carrier while the opposite surface is provided with bumps or pads for making contact with the conductive terminals of the semiconductor devices. Examples of such carriers are shown in the patent to Aird, U.S. Pat. No. 3,689,991 and in the patent to Galli et al., 3,781,596.

As disclosed by way of example in these patents, the carrier is provided with bonding pads or bumps which serve the purpose to connect the carrier to the conductive terminals of the semiconductor devices. The carriers are usually in the form of tapes and may be provided with longitudinally spaced apertures or sprocket holes for purposes of registration. The pads are bonded to the terminals or contacts of the semiconductor devices by a thermal bonding process, also described in the patent to Aird, above referred to.

In order for the thermal bonding device to pass through the carrier, a suitable aperture is provided in the carrier adjacent the bumps.

It has been found in the past that it is difficult to control the relatively small size of the bumps which may be on the order of 3 mils or less in diameter. This is particularly difficult with conventional chemical etching, which not only takes place both from the lead circuit side and the bump circuit side. Also it has been found that the leads become so thin that they are liable to break, either during use or while being subjected to pull tests.

SUMMARY OF THE INVENTION

In accordance with the present invention, there is provided a process for the manufacture of carriers of the type referred to hereinabove. In particular, the process of the invention makes it possible to generate small size bumps having a diameter on the order of 3 mils by chemical etching.

The carrier basically consists of a sheet of copper which may have a thickness of 3 mils. Both sides of the copper are covered with photoresist which is then illuminated through a suitable mask on one side to form a lead circuit and on the opposite side to form a bump circuit. The photoresist is then developed to remove the photoresist from those surface areas from which the copper is to be removed. A suitable etching solution for copper, such as ferric chloride, is applied to only the lead side of the copper sheet. Eventually the exposed copper is removed from the lead side to form an aperture and the etching solution will run onto the opposite surface carrying the bump circuit. This will then remove a portion of the exposed copper so that the bump circuit remains.

Subsequently, the photoresist may be entirely removed and the etched sheet polished. To this end the sheet may be dipped into another etching solution for copper, such for example as ammonium persulfate for approximately 15 to approximately 20 minutes. This in turn will polish the bumps and will reduce the diameter of the bump by approximately 1 mil. This is accomplished by etching about one-half a mil in each direction from the bump. This does not substantially reduce the thickness of the lead portion which still has a thickness of say one mil or more.

The thus prepared carrier is then plated with nickel and subsequently plated with gold. The carrier may then be subsequently treated as disclosed in the copending application to Dugan and Phillips above referred to.

DESCRIPTION OF THE PREFERRED EMBODIMENTS

Figure 1:
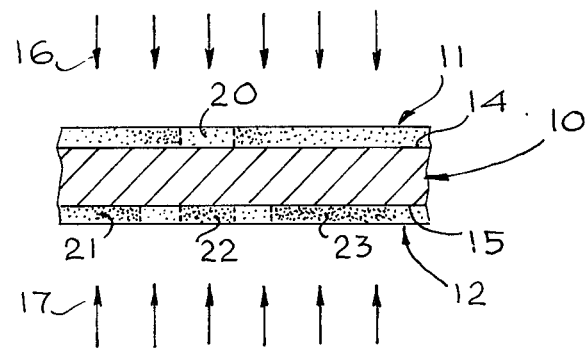
FIGS. 1-5 are a series of fragmentary sectional views corresponding to the successive process steps in the preparation of a carrier for use with semiconductor devices in accordance with the present invention.

Referring now to the drawing, there is illustrated in FIGS. 1-5 the process of the present invention for preparing a carrier for semiconductor devices. The carrier is represented by a sheet 10 which may, for example, consist of copper and which may have a thickness of three mils. As shown in FIG. 1, both surfaces of the copper sheet are covered with a layer of photoresist as shown at 11 and 12. It may be assumed that the top surface 14 of the copper sheet 10 will eventually represent the lead circuit; that is, the circuit which makes contact to the external circuit terminals for the semiconductor device. The other surface 15 represents the bump circuit comprising raised pads or bumps which in turn are intended to make contact with the conductive terminals of the semiconductor chips.

Figure 2:
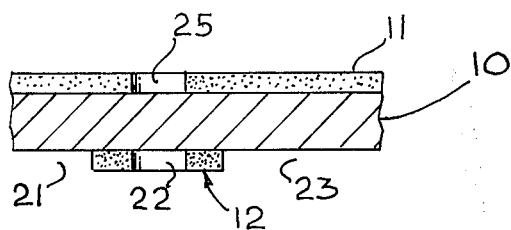

The photoresist layer 11 is now illuminated with light as indicated by the arrows 16 through a suitable mask to form the lead circuit. Similarly, the photoresist 12 is also illuminated by light as shown by arrows 17 through another suitable mask to form the bump circuit. The photoresist layers 11 and 12 are now developed to bare those areas of the sheet 10 which are to be removed by etching. Thus, the portion 20 of the photoresist layer 11 is to be removed as shown by dotted lines 20 as are the areas 21, 22 and 23 of the photoresist layer 15 to form a bump circuit. The resulting structure is illustrated in FIG. 2. Here the photoresist layer 11 is provided with an island 25 through which an opening is to be made through the copper sheet 10. Similarly, the photoresist layer 12 has been removed as shown at 21, 22 and 23 to form the bump circuit.

A chemical etchant is now applied to the surface 14 of the copper sheet 25 which forms the lead circuit. The chemical etchant, may for example, consist of ferric chloride. Eventually the etching solution will dissolve through the copper sheet along the island 25 to form an aperture 28 (see FIG. 3). This opening or aperture 28 is formed adjacent the bumps to be formed and serves the purpose of applying heat from the lead circuit represented by surface 14 to an underlying semiconductor structure. It will, of course, be realized that the original copper sheet 10 is continuous and what is shown in FIG. 3 is only a partial sectional view.

Eventually, after the etching solution has dissolved through the copper sheet 10, it will run to the bump surface 15 of the copper sheet and dissolve away a portion of the original copper sheet 10 as shown at 30 and 31. This will leave the bumps 32 as high as the original sheet of copper. In other words, the bumps (assuming a sheet three mils thick) have the same height. On the other hand, only about one mil of the copper is removed from the lead portions 30 and 31. Therefore, the lead portions still have a height of say, two mils, while the bumps 32 have a height of three mils and a diameter of three to five mils.

The thickness of the lead portion of say two mils is sufficient to prevent the leads from breaking under lead pull tests or as used in actual service.

Figure 3:
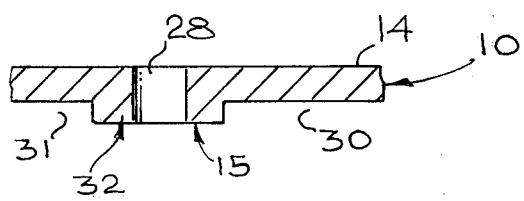

The structure shown in FIG. 3 is now additionally polished. This may, for example, be effected by another etching solution for copper, such as ammonium persulfate. This etching step may be carried out for approximately 15 or 20 minutes. In any case, the etching is continued until half a mil of the copper is removed. This, of course, results in a reduction of the bump diameter of one mil. At the same time, this etching process does not materially reduce the thickness of the lead circuit which is still between one mil and 1.5 mil in thickness. The main purpose of this etching or polishing step is to reduce the diameter of the bump circuit 32, which is initially made larger than the desired final size. Also the polishing will remove the rough edges of the bumps. The final diameter of the bump is such as to match the dimension of the chip contact pad which is generally about four mils square.

Figure 4:
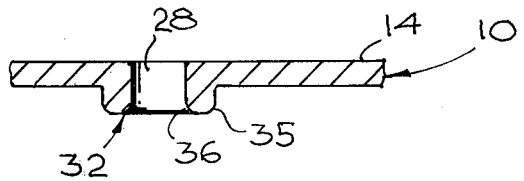

FIG. 4 shows the result of the polishing step where the lead circuit surface 14 and the aperture 28 remain substantially unchanged. On the other hand, the edges 35 and 36 of each bump 32 have been rounded or polished as illustrated.

Alternatively, and preferably, the carrier structure of FIG. 3 may be polished by electropolishing. In this case, the structure of FIG. 3 may be placed in a suitable electrolytic bath. The carrier is oriented in such a manner that the bumps 32 face the anode of the bath circuit. In such a bath, the electric current tends to concentrate at the sharp edges. Therefore, a selective etching takes place at the edges 35, 36 of the bumps 32 to round off the sharp edges. This procedure again will reduce the diameter of the bumps as explained hereinbefore.

It should be noted that electropolishing of the type disclosed herein is well known in the art. It has been described, for example, in the patents to Dobbin et al., 3,314,869, the patent to Gwyn, Jr., 3,519,543 and in the patent to Ono et al., 3,719,567.

Figure 5:
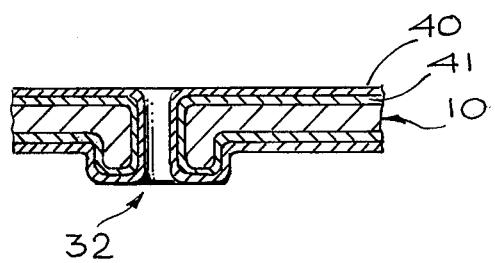

The structure of FIG. 4 is now gold plated with a gold layer 40 as shown in FIG. 5. Preferably before the gold plating is effected, a layer of nickel 41 (FIG. 5) may be first disposed on the carrier of FIG. 4.

It should be noted that the particular etching process as explained in connection with FIGS. 2 and 3, by applying the etching solution only on the lead circuit surface of the structure, makes it possible to create bumps having a relatively small size. In the past, it has been very difficult to control the diameter of the bumps where conventional chemical etching takes place simultaneously from both sides. Furthermore, as indicated before, the conventional etching step tends to develop leads having a thickness of between one-half to one mil. Such leads are generally too thin and tend to break either in actual service or during pull tests.

The polishing step explained in connection with FIG. 4 permits a rather precise control of the diameter of the bumps and also tends to remove sharp corners.

It will be realized that the final carrier is also provided with precisely spaced apertures on both sides which are sometimes referred to as sprocket holes. The gold plating serves the purpose to control further etching steps which may be carried out to perforate carriers disposed adjacent to each other on a large copper sheet.

There has thus been disclosed a process of manufacturing a carrier for semiconductor devices such as integrated circuit chips. The process is characterized in particular by a novel etching step which permits the generation of smaller size bumps or contact pads than has been possible heretofore. At the same time, the process can be controlled in such a manner that the thickness of the leads is sufficient to substantially prevent breakage either in service or during pull tests. Additionally, the carrier may be polished either by a relatively weak etching solution or by electropolishing. This in turn will reduce the diameter of the bumps to correspond to the area of the contact pad of the chip.

Although there have been described above particular methods of making circuitry with bump contacts in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. A process for manufacturing a carrier suitable for semiconductor components and integrated chips, said process comprising the steps of:
    (a) coating both sides of a sheet of copper with a photoresist material;
    (b) exposing the photoresist material on one side of the copper sheet to light in accordance with a desired lead pattern and exposing the photoresist material on the opposite side of the copper sheet to light in accordance with a desired bump pattern;
    (c) developing the photoresist to expose those portions of the copper sheet to be etched away;
    (d) applying a first etching solution to the lead circuit side only of the copper sheet, whereby the etching solution will eventually contact the bump circuit side after etching through an aperture to etch away the copper on the bump circuit side to a lesser depth than on the lead circuit side except for the desired bump portions;
    (e) removing all of the remaining photoresist material; and
    (f) polishing the bump circuit to remove sharp edges.

2. A process as defined in claim 1 wherein the etching solution consists of ferric chloride.

3. The process defined in claim 1 wherein the bump circuit is polished by etching it with ammonium persulfate for a period of time sufficient to remove sharp edges from the bumps of the bump circuit.

4. A process as defined in claim 1 wherein the bump circuit is polished by electropolishing by orienting the bumps toward the anode of an electropolishing bath.

5. A process as defined in claim 1 wherein the polished bump circuit and lead circuit is gold plated.

6. A process as defined in claim 1 wherein the polished bump circuit and the lead circuit is first nickel plated and subsequently gold plated.

7. A process as defined in claim 3 wherein the copper sheet has a thickness of approximately three mils and the bump circuit is exposed to the ammonium persulfate etching solution for a period of time sufficient to reduce the diameter of the bumps by approximately one mil.

* * * * *